United States Patent
Shao et al.

(10) Patent No.: US 11,825,628 B2
(45) Date of Patent: Nov. 21, 2023

(54) HYBRID COOLING SYSTEM FOR ELECTRONIC RACKS

(71) Applicant: Baidu USA LLC, Sunnyvale, CA (US)

(72) Inventors: Shuai Shao, Sunnyvale, CA (US); Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 0 days.

(21) Appl. No.: 16/997,497

(22) Filed: Aug. 19, 2020

(65) Prior Publication Data

US 2022/0061187 A1 Feb. 24, 2022

(51) Int. Cl.
*H05K 7/20* (2006.01)
*H01L 35/02* (2006.01)
*H10N 10/80* (2023.01)

(52) U.S. Cl.
CPC ..... *H05K 7/20254* (2013.01); *H05K 7/20409* (2013.01); *H05K 7/20636* (2013.01); *H10N 10/80* (2023.02); *H05K 7/20781* (2013.01)

(58) Field of Classification Search
CPC ........... H05K 7/20254; H05K 7/20209; H05K 7/20409; H05K 7/20636; H05K 7/20781; H01L 35/02
USPC .......................................................... 361/699
See application file for complete search history.

(56) References Cited

U.S. PATENT DOCUMENTS

| | | | | |
|---|---|---|---|---|
| 5,040,381 A * | 8/1991 | Hazen | ...................... | H01L 23/38 62/3.1 |
| 5,419,780 A * | 5/1995 | Suski | ...................... | H01L 35/30 136/224 |
| 5,456,081 A * | 10/1995 | Chrysler | .................. | H01L 23/38 165/185 |
| 5,460,441 A * | 10/1995 | Hastings | .................. | G06F 1/188 361/679.48 |
| 5,896,273 A * | 4/1999 | Varghese | ................. | G06F 1/181 361/679.33 |
| 6,021,047 A * | 2/2000 | Lopez | .................. | H05K 7/1489 312/223.2 |
| 6,164,076 A * | 12/2000 | Chu | ........................ | H01L 35/32 62/3.7 |

(Continued)

OTHER PUBLICATIONS

"Thermoelectric Coolers Intro the Basics", TEC Microsystems GmbH, accessed online on Jun. 15, 2020, available at: <https://www.tec-microsystems.com/faq/thermoelectic-coolers-intro.html> online.

*Primary Examiner* — Anatoly Vortman
(74) *Attorney, Agent, or Firm* — WOMBLE BOND DICKINSON (US) LLP

(57) ABSTRACT

According to one embodiment, a hybrid cooling system includes a cold plate that is arranged to mount on an IT component that is mounted on a piece of IT equipment, the cold plate is arranged to receive coolant via a supply line and to return warmed coolant via a return line, the warmed coolant is produced by the cold plate when the cold plate is in contact with the IT component and heat generated by the IT component is transferred into the coolant by the cold plate; a TEC element that is arranged to couple to the IT component; and a heat sink that includes a base that is arranged to couple to the TEC element and one or more fins, the TEC element is configured to transfer at least a portion of the heat generated by the IT component into the one or more fins of the heat sink.

12 Claims, 8 Drawing Sheets

(56) References Cited

U.S. PATENT DOCUMENTS

| | | | | |
|---|---|---|---|---|
| 6,234,240 B1* | 5/2001 | Cheon | G06F 1/20 | 165/185 |
| 6,415,612 B1* | 7/2002 | Pokharna | H01L 23/38 | 62/3.2 |
| 6,567,262 B2* | 5/2003 | Meir | G06F 1/20 | 361/676 |
| 6,705,089 B2* | 3/2004 | Chu | H01L 35/30 | 257/E23.098 |
| 6,711,904 B1* | 3/2004 | Law | H01L 23/34 | 62/3.2 |
| 6,728,653 B1* | 4/2004 | Figueredo | G01R 31/318505 | 324/750.08 |
| 6,807,056 B2* | 10/2004 | Kondo | H05K 7/20781 | 361/689 |
| 7,104,312 B2* | 9/2006 | Goodson | F28F 3/048 | 174/15.1 |
| 7,185,500 B2* | 3/2007 | Meir | G06F 1/20 | 62/3.2 |
| 7,290,596 B2* | 11/2007 | Yang | H01L 23/367 | 257/E23.09 |
| 7,466,553 B2* | 12/2008 | Hamman | H01L 23/473 | 62/3.2 |
| 7,939,743 B2* | 5/2011 | Leng | H01L 35/00 | 136/224 |
| 8,453,467 B2* | 6/2013 | Hood, III | F25B 21/02 | 62/3.2 |
| 8,522,570 B2* | 9/2013 | Ouyang | H01L 35/30 | 62/3.7 |
| 9,099,426 B2* | 8/2015 | McCluskey | H01L 23/38 | |
| 9,968,012 B2* | 5/2018 | Terasaki | C04B 37/026 | |
| 9,983,641 B2* | 5/2018 | Kulkarni | G06F 1/206 | |
| 2002/0191430 A1* | 12/2002 | Meir | G06F 1/20 | 363/141 |
| 2005/0068737 A1* | 3/2005 | Leija | H01L 23/467 | 257/E23.099 |
| 2005/0174737 A1* | 8/2005 | Meir | G06F 1/20 | 361/697 |
| 2006/0060333 A1* | 3/2006 | Chordia | F28D 15/0266 | 257/E23.098 |
| 2007/0163270 A1* | 7/2007 | Chien | F25B 21/02 | 257/E23.098 |
| 2011/0056509 A1* | 3/2011 | Benest | A45D 20/10 | 132/223 |
| 2012/0047911 A1* | 3/2012 | Bhavsar | F25D 11/00 | 62/3.6 |

* cited by examiner

HYBRID COOLING SYSTEM FOR ELECTRONIC RACKS

FIELD

Embodiments of the present disclosure relate generally to a hybrid cooling system that includes a cold plate and a thermoelectric cooling (TEC) element for cooling electronic racks.

BACKGROUND

Thermal management for a data center that includes several active electronic racks is critical to ensure proper performance of servers and other IT equipment (e.g., performing IT data processing services) that is operating in the racks. Without proper thermal management, however, the thermal environment (e.g., temperature) within the racks may exceed thermal operational thresholds, which may result in adverse consequences (e.g., servers failing, etc.). One way to manage the thermal environment is the use cooling air to cool the IT equipment. The cooling air is recirculated using cooling units that extract heat captured by the cooling air. One commonly used cooling unit is a computer room air conditioning (CRAC) unit that is a device that intakes hot exhaust air and supplies cooling air into the data center to maintain the data center's thermal environment. The CRAC is an air cooling unit that is widely used in existing air cooled data centers, and there are many other types of solutions for air cooled data centers. Also, a majority of existing data centers are air cooled.

Recently, data centers have been deploying more high-power density electronic racks, where more high-density chips are packaged closer together to provide more processing power. This is especially the case due to developments in artificial intelligence (AI) and cloud-based services, which requires high performance and high power density processors, such as control processing units (CPUs) and graphic processing units (GPUs). Cooling these high-density racks by maintaining a proper thermal environment may be an issue with existing cooling systems, such as a CRAC unit. For instance, although the CRAC unit may maintain the thermal environment with more conventional (or lower-density) racks, the unit may be unable to effectively cool high-power density racks because they may generate heat load at a higher rate due to the higher density electronics. In some cases, liquid cooling becomes a more efficient and feasible cooling solution in high power density or high heat flux scenarios.

BRIEF DESCRIPTION OF THE DRAWINGS

The aspects are illustrated by way of example and not by way of limitation in the figures of the accompanying drawings in which like references indicate similar elements. It should be noted that references to "an" or "one" aspect of this disclosure are not necessarily to the same aspect, and they mean at least one. Also, in the interest of conciseness and reducing the total number of figures, a given figure may be used to illustrate the features of more than one aspect, and not all elements in the figure may be required for a given aspect.

DETAILED DESCRIPTION

Figure 1:
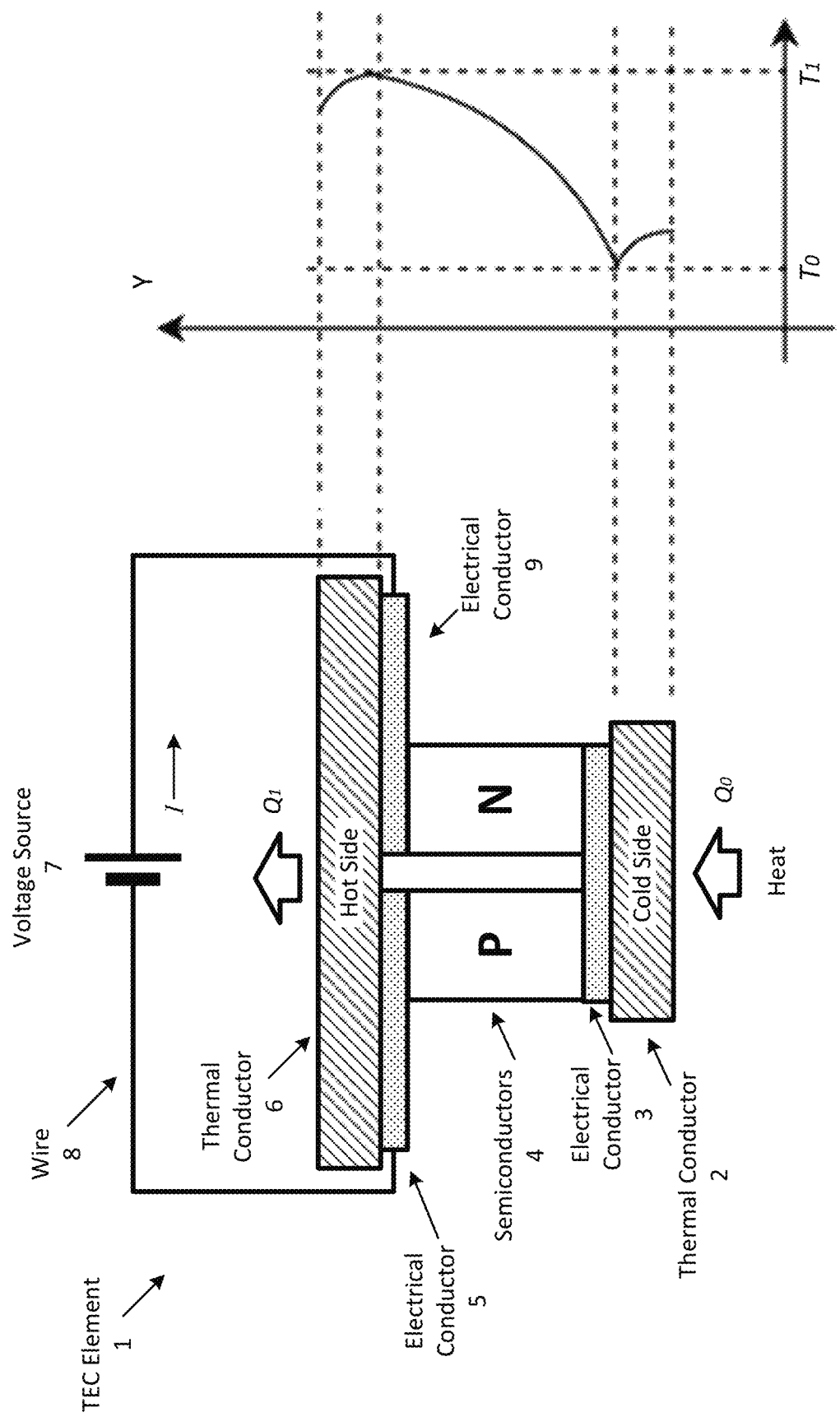
FIG. 1 is a block diagram illustrating an example of a thermoelectric cooling (TEC) element according to one embodiment.

Several aspects of the disclosure with reference to the appended drawings are now explained. Whenever the shapes, relative positions and other aspects of the parts described in a given aspect are not explicitly defined, the scope of the disclosure here is not limited only to the parts shown, which are meant merely for the purpose of illustration. Also, while numerous details are set forth, it is understood that some aspects may be practiced without these details. In other instances, well-known circuits, structures, and techniques have not been shown in detail so as not to obscure the understanding of this description. Furthermore, unless the meaning is clearly to the contrary, all ranges set forth herein are deemed to be inclusive of each range's endpoints.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment.

A liquid cooling system may include one or more cold plates that are mounted on top of information technology (IT) components (e.g., processors) that are themselves mounted on a piece of IT equipment (e.g., a printed circuit board (PCB)). To cool the processors, heat generated by the processors is transferred into liquid coolant that is flowing through the cold plates. If, however, the coolant stops moving inside the cold plates, which could be caused by pump failure, leakage, blocked connectors or lines (hoses), etc., the system's cooling capability may become compromised and as a result the processors may fail (or stop working) due to overheating. The present disclosure solves this problem by providing a hybrid cooling system that includes a cold plate and a thermoelectric cooling (TEC) element (or device). In one embodiment, the TEC element provides a cooling redundancy that may be configured to cool an IT component in situations in which the component's cold plate fails (e.g., fluid ceases to flow through the plate). In lieu of (or in addition to) providing redundant cooling, the TEC element may be arranged to enhance the existing thermal performance of the cold plate, when a lower IT component temperature is needed, or when the IT component has a higher power density.

According to one embodiment, a hybrid cooling system includes a cold plate that is arranged to mount on an information technology (IT) component that is mounted on a piece of IT equipment, the cold plate is arranged to receive coolant from a coolant source via a supply line and return warmed coolant to the coolant source via a return line, the warmed coolant is produced by the cold plate when the cold plate is in contact with the IT component and heat generated by the IT component is transferred into the coolant by the cold plate, a thermoelectric cooling (TEC) element that is arranged to couple to the IT component, and a heat sink that includes a base that is arranged to couple to the TEC element and one or more fins. The TEC element is configured to transfer at least a portion of the heat generated by the IT component into the one or more fins of the heat sink.

In one embodiment, the cold plate is disposed between the IT component and the TEC element such that the TEC element is mounted on the cold plate and the cold plate is mounted on the IT component, wherein the portion of the heat that is transferred by the TEC element is drawn from the cold plate. In another embodiment, a thermal interface material is disposed between 1) the IT component and the cold plate, 2) the cold plate and the TEC element, and 3) the TEC element and the heat sink.

In one embodiment, the TEC element and the cold plate are mounted on the IT component and are adjacent to one another. In some embodiments, the TEC element is a first TEC element, wherein the first TEC element is adjacent to a first side of the cold plate, wherein the hybrid cooling system further comprises a second TEC element that is mounted on the IT component and is adjacent to a second side of the cold plate that is opposite to the first side. In another embodiment, the base of the heat sink is mounted on the first TEC element, the second TEC element, and the cold plate.

In one embodiment, the hybrid cooling system further includes a controller that is configured to activate the TEC element to begin the transfer of the portion of the heat into the one or more fins in response to determining that a temperature of the IT component exceeds a threshold temperature. In another embodiment, the hybrid cooling system further includes one or more fans that are arranged to push ambient air onto the one or more fins of the heat sink, wherein the controller is further configured to set a fan speed of the one or more fans to a maximum speed in response to determining that the temperature of the IT component exceeds the threshold temperature.

According to another embodiment, an electronic rack includes several pieces of IT equipment arranged in a stack for providing data processing services, each of the pieces of IT equipment includes one or more processors. For at least one of the processors, the electronic rack includes a cold plate, a TEC element, and a heatsink as previously described.

According to another aspect, a method for cooling an IT component that is mounted on a piece of IT equipment includes determining that a temperature of the IT component is above a threshold temperature, wherein mounted on the IT component is a cold plate that is arranged to liquid cool the IT component by transferring heat generated by the IT component while the IT component is active into coolant that flows through the cold plate. The method, in response to determining that the temperature is above the threshold temperature, activates one or more TEC elements that are coupled to the IT component to transfer at least a portion of the heat generated by the IT component into a heat sink that is coupled to the TEC element.

In one embodiment, the method determines, after a period of time from the activation of the one or more TEC elements, whether the temperature of the IT component is below the threshold temperature; and in response to determining that the temperature of the IT component is not below the threshold temperature, deactivates the IT component. In another embodiment, the method further includes, in response to determining that the temperature is above the threshold, setting a fan speed of one or more fans to a maximum speed, wherein each of the fans are arranged to push ambient air onto the heat sink. In some embodiments, the cold plate is disposed between the IT component and the TEC element such that the TEC element is mounted on the cold plate and the cold plate is mounted on the IT component, wherein the portion of the heat that is transferred by the TEC element is drawn from the cold plate. In another embodiment, the method further includes determining an input current for each of the one or more TEC elements based on the determined temperature, where activating the one or more TEC elements includes supplying each of the one or more TEC elements with the input current.

In one embodiment, as used herein, "to couple" one component (or element) to another component may refer to "fluidly" coupling the two components together in order to allow a fluid, such as a cooling liquid or liquid coolant to flow between the two components. For example, coupling a first tube to a second tube may couple both tubes together and also allow a fluid to flow from the first tube into the second tube.

Figure 4:
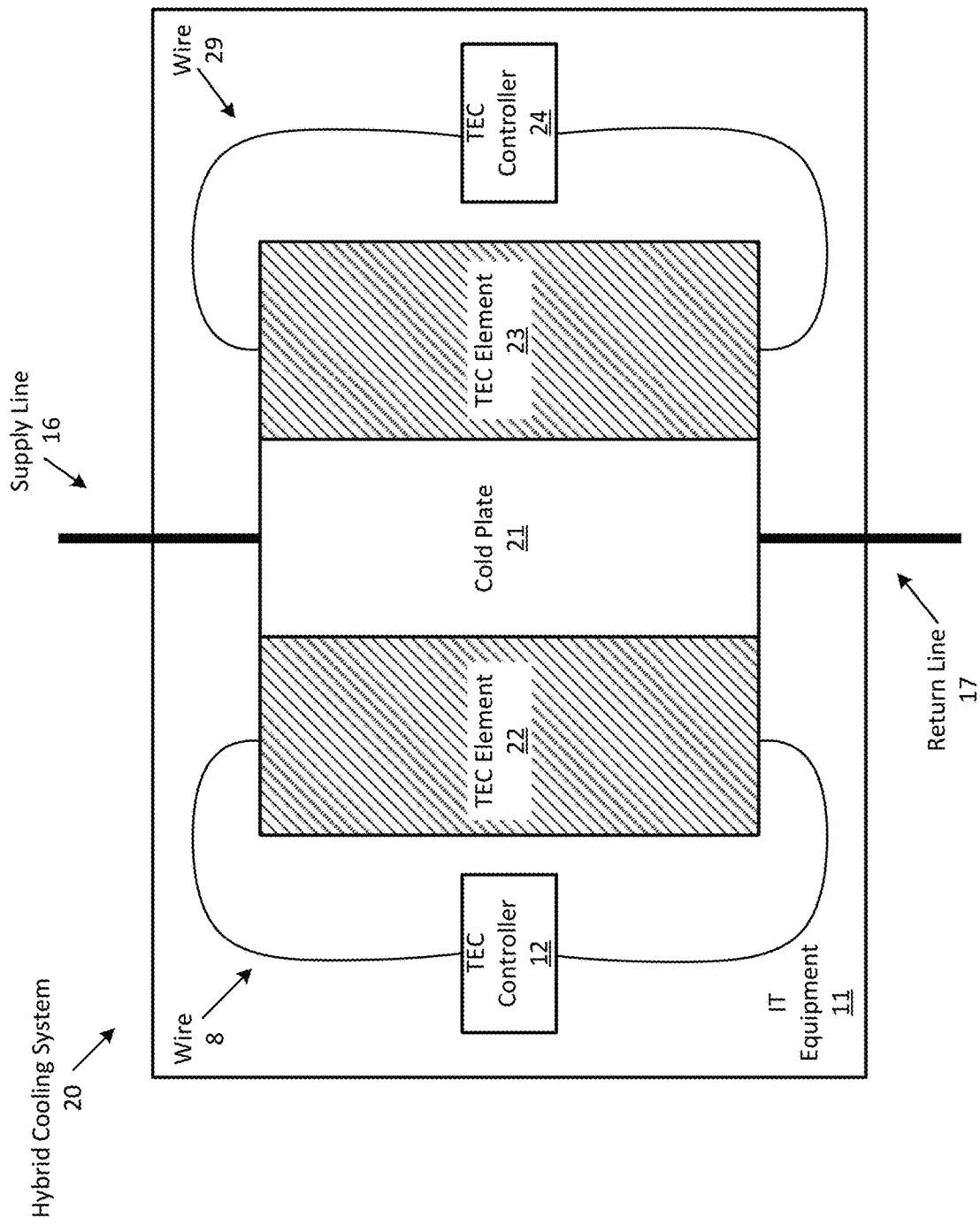
FIG. 4 is a block diagram illustrating a top-down view of the hybrid cooling system illustrated in FIG. 3.

FIG. 1 is a block diagram illustrating an example of a TEC element (or TEC device) according to one embodiment. This figure shows a TEC element 1 that has (at least) two semiconductors 4, a p-type semiconductor and a n-type semiconductor, having different electron densities (e.g., n-type>p-type). These semiconductors may be arranged as pillars that are placed thermally in parallel to each other, and electrically in series by an electrical conductor 3 that is connected to a thermal conductor 2. Each end of the semiconductors that is not connected to the electronic conductor 3 is connected to a separate conductor. In particular, the p-type semiconductor is connected to an electrical conductor 5, while the n-type semiconductor is connected to another electrical conductor 9, which is separate from conductor 5. Both of the electrical conductors 5 and 9 are connected to another thermal conductor 6. In addition, the electrical conductor 5 is electrically coupled to a negative terminal of a voltage source 7 and the electrical conductor 9 is electrically coupled to a positive terminal of the voltage source (e.g., via one or more wires 8). In one embodiment, the voltage source may be an external voltage source (e.g., separate from the TEC element 1). In another aspect, the voltage source and the TEC element may be coupled to one another. For example, both elements may be a part of an electrical component (e.g., both mounted on a PCB board). In some embodiments, the voltage source may be a part of one or more controllers, such as the TEC controllers 12 and/or 24 as shown in FIG. 4, for example.

In one embodiment, any of the components of the TEC element may be composed of any (known) material. For example, the thermal conductors 2 and 6 may be made of a ceramic material, which can conduct heat but not electricity. As another example, the electrical conductors 3, 5, and/or 9 may be composed of any conductor material (e.g., copper, etc.).

The TEC element is arranged to move heat from one surface to another surface, at the cost of extra external electrical power. Specifically, when a voltage (e.g., 10 volts) is applied by the voltage source 7 across the two electrical conductors 5 and 9, a current I (e.g., 10 amperes) passes through the semiconductors, causing the TEC element to transfer heat $Q_0$ from the "cold side" to the "hot side". Thus, a temperature difference is generated by the semiconductor 4 as current passes through it, as shown by $T_0-T_1$. The heat that is ultimately expelled out of the hot side is $Q_1$, which may be greater than $Q_0$ because $Q_1$ includes $Q_0$ and any heat, $Q'$ that generated by the TEC element while the TEC element is active. In other words, $Q_1=Q_0+Q'$. Thus, during operation as part of a hybrid cooling system as described herein, the thermal conductor 2 may be coupled to (e.g., mounted on) an IT component, such that the TEC element draws $Q_0$ generated by the IT component away from the component and into the thermal conductor 6. Drawing this heat away from the IT component thus cools the IT component while it is active and the TEC element is operational.

Figure 2:
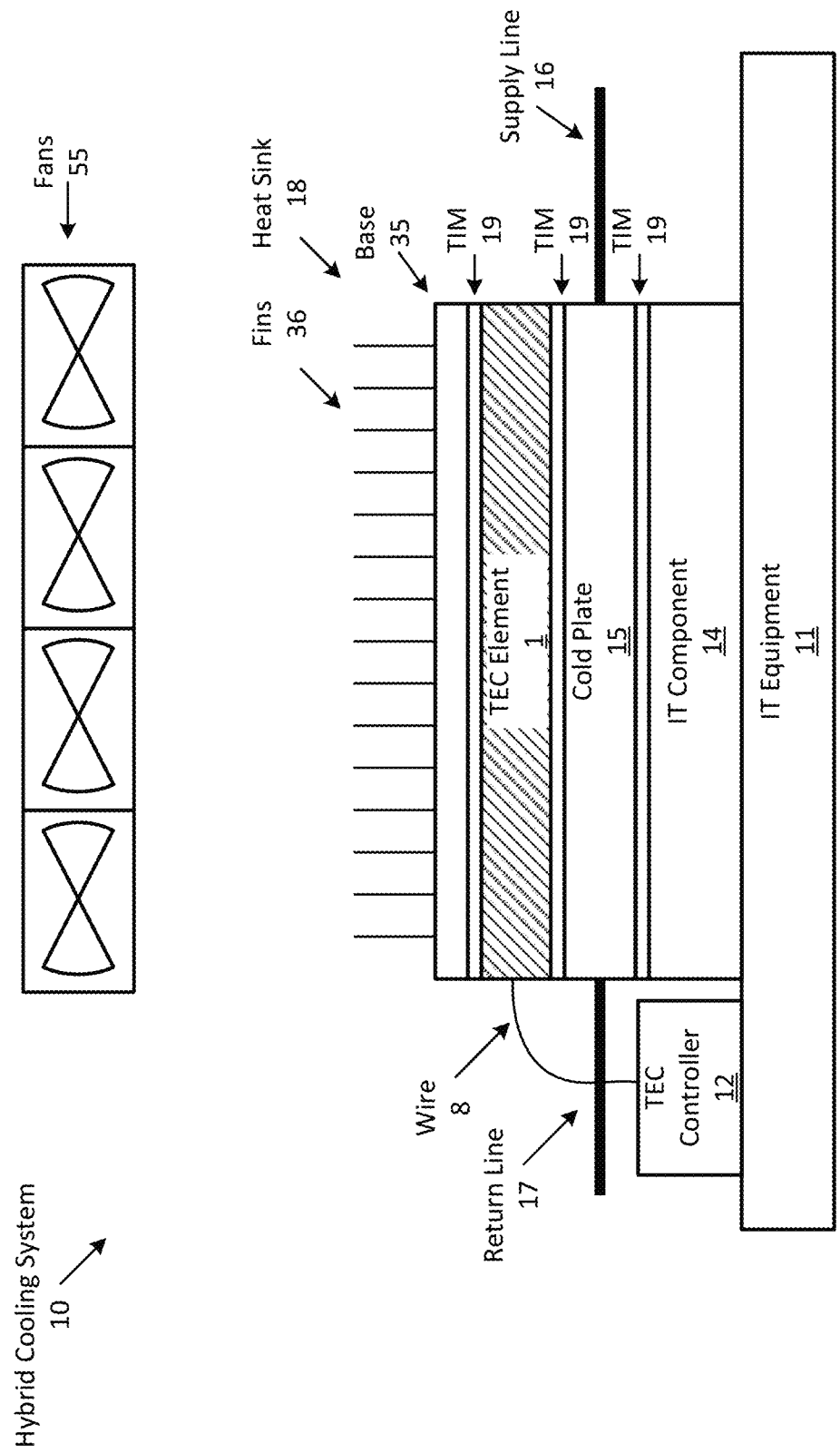
FIG. 2 is a block diagram illustrating an example of a hybrid cooling system that includes a cold plate and a TEC element according to one embodiment.

FIG. 2 is a block diagram illustrating an example of a hybrid cooling system that includes a cold plate and a TEC element according to one embodiment. Specifically, this figure shows a hybrid cooling system 10 that includes a heat sink 18, the TEC element 1, a cold plate 15, a TEC controller 12, and one or more fans 55. In one aspect, the system may include more or less elements, such as having one or more heat sinks, or not having the fans.

As shown, the IT component 14 is arranged to couple to (e.g., mount on) a piece of IT equipment 11. In addition, coupled to the IT component is the cold plate 15, the TEC element 1, and the heat sink 18. In particular, the cold plate is disposed between the IT component and the TEC element such that the TEC element is mounted on the cold plate and the cold plate is mounted on the IT component.

A description of each element will now be described. The piece of IT equipment 11 may be any element that is arranged to hold one or more IT components and/or any type of electrical component, such as the TEC controller 12. In some embodiments, the piece of IT equipment may be a blade server that is arranged to be mounted in an electronic rack, such as rack 500 illustrated in FIG. 8.

The piece of IT equipment 11 may include one or more IT components 14 (e.g., central processing units or CPUs, graphical processing units (GPUs), memory, and/or storage devices). The IT component may perform data processing tasks, where the IT component may include software installed in a storage device, loaded into the memory, and executed by one or more processors to perform the data processing tasks. In one embodiment, the piece of IT equipment may include a host server (referred to as a host node) coupled to one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the performance computing nodes or compute servers (having one or more GPUs) managed by the host server. The performance compute servers (e.g., the IT component 14) perform the actual tasks, which may generate heat during the operations. This heat, as described herein needs to be transferred away from the component in order to ensure that it does not overheat, which may result in failure.

The cold plate 15 is arranged to (e.g., thermally) couple to the IT component 14. Coupled (or fluidly coupled) to the cold plate is a supply line 16 that is coupled to (e.g., an inlet of) the cold plate, and a return line 17 that is coupled to (e.g., an outlet of) the cold plate. Both the supply line and the return line are also coupled to a coolant source (not shown). In one aspect, the coolant source may an IT liquid cooling water system or any type of cooling fluid source. The coupling of these elements of the system 10 creates a heat exchanging loop. For instance, the cold plate is arranged to receive (liquid) coolant from the coolant source via the supply line and return warmed coolant to the coolant source via the return line. The warmed coolant is produced by the cold plate when the cold plate is in contact with (e.g., coupled to) the IT component and heat generated by the IT component (while the component is operating (active), such as performing one or more operations as described herein) is transferred into the coolant by the cold plate. Warmed coolant may be cooled by a heat exchanger (e.g., at the coolant source), and the cooled coolant is then recirculated back to the cold plate. In one aspect, the coolant is circulated by any method, such as liquid pumps (not shown).

The TEC element 1 is arranged to couple to the IT component 14. As described herein, this figure shows that the TEC element is mounted on the cold plate 15. Coupled to the TEC element is the heat sink 18, which includes a base 35 and one or more fins 36. In particular, the base is arranged to couple to (e.g., mount on) the TEC element. Thus, the IT component, cold plate, TEC element, and heat sink are arranged in a stack. In this example, each of the elements may be separate elements which may be removeably coupled within the stack. For example, the cold plate may be removed from atop the IT component and the TEC element may be separated from the cold plate. As a result, elements may be added/removed as needed. In another embodiment, at least some of the elements may be packaged together as one integrated unit. For example, the (e.g., base of the) heat sink and the TEC element may be one integrated unit.

The TEC element is configured to transfer at least a portion of the heat generated by the IT component (e.g., $Q_0$) into the one or more fins 36 of the heat sink 18. For example, in this figure, the portion of the heat that is transferred by the TEC element is drawn from the cold plate 15. Thus, the cold side (e.g., thermal conductor 2, shown in FIG. 1) of the TEC element is coupled to the cold plate and the hot side (e.g., the thermal conductor 6, shown in FIG. 1) of the TEC element is coupled to the heat sink 18. More about operating TEC element is described herein.

Disposed between these elements is a thermal interface material (TIM) 19, which may be a thermal pad, a thermal adhesive tape, and/or a thermal conductive paste. Specifically, TIM is disposed between 1) the IT component and the cold plate, 2) the cold plate and the TEC element, and 3) the TEC element and the (base of the) heat sink. In one embodiment, TIM 19 may not be disposed between at least some of the elements. For example, the TEC element and the heat sink may be directly coupled to one another. As another example, TIM may not be disposed between two elements that form one integrated unit, as may be the case when the TEC element and the heat sink are one integrated unit, as described herein.

Figure 8:
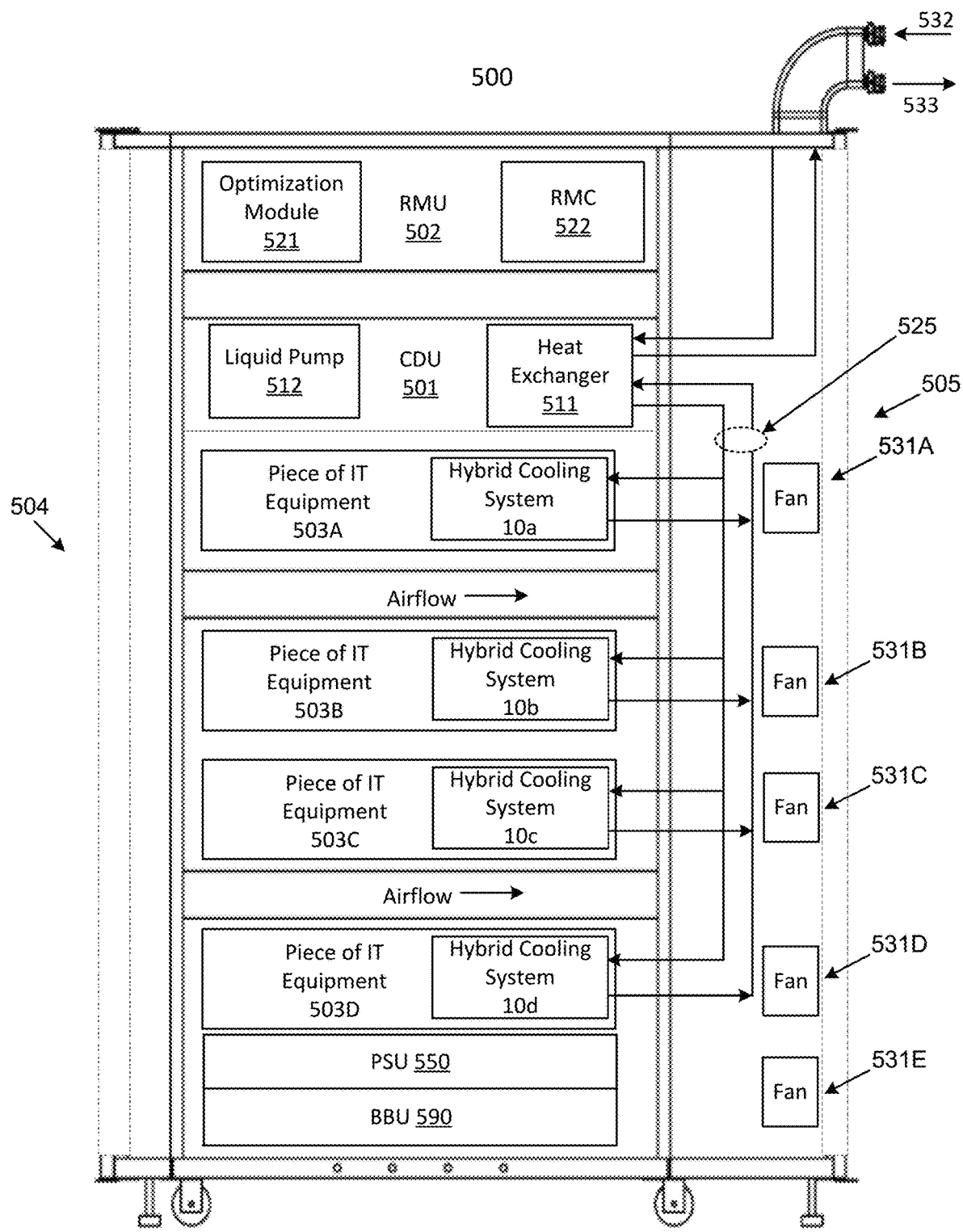
FIG. 8 is an example of an electronic rack with a hybrid cooling system according to one embodiment.

The TEC controller 12 may be a special-purpose processor such as an application-specific integrated circuit (ASIC), a general purpose microprocessor, a field-programmable gate array (FPGA), a digital signal controller, or a set of hardware logic structures (e.g., filters, arithmetic logic units, and dedicated state machines). In one embodiment, the TEC controller may be a circuit with a combination of analog elements (e.g., resistors, capacitors, inductors, etc.) and/or digital elements (e.g., logic-based elements, such as transistors, etc.). The TEC controller may also include memory. As shown, the TEC controller and the IT component 14 are separate elements that are coupled to (e.g., mounted on) the piece of IT equipment 11. In one embodiment, the TEC controller 12 may be a part of the TEC element 1 (e.g., within one container). In another embodiment, the TEC controller may be a part of (or integrated within) the IT component 14. In another embodiment, the TEC controller may be one of (or a part of) another piece of IT equipment that is mounted in an electronic rack 500, as shown in FIG. 8.

As shown, the TEC controller 12 is (e.g., electrically) coupled via one or more wires 8 to the TEC element 1. The TEC controller is configured to activate (or operate) the TEC element, such that the TEC element may (e.g., begin to) transfer (at least a portion of the) heat generated by the IT component into (one or more of the fins 36 of) the heat sink 18, as described herein. Specifically, the TEC controller includes a power source (or is electrically coupled to a power source, which may be a part of the piece of IT equipment 11 or may be an external power source) from which the TEC controller draws power to supply the TEC element with an input current in order to activate the element. In one embodiment, the TEC controller may activate the TEC element in response to determining that an IT component temperature (e.g., sensed by a temperature sensor coupled to or a part of the IT component 14) is above a temperature threshold. For example, the temperature may exceed the threshold when there is a failure within the heat exchanging loop (e.g., coolant stops circulating within the cold plate in response to a liquid pump failure, there is a coolant leak that results in less coolant flowing through the cold plate, etc.). Once activated, heat generated by the IT component transfers through the cold plate and the TEC element, into the heat sink. The heat is then transferred into the fins of the heat sink and is then rejected into (e.g., forced) air that flows onto and through the fins. Specifically, the forced air may be created by the one or more fans 55 that are arranged to push (or pull) ambient air onto the fins 36 of the heat sink 18. In another embodiment, the TEC controller is configured to adjust the cooling performance of the TEC element by regulating the input current. More about activating the TEC element and regulating the input current is described herein.

As described herein, the TEC controller 12 may be configured to activate the TEC element 1 in response to determining an IT component temperature is above (or equal to) the temperature threshold. In one embodiment, while the component temperature is below the threshold, the TEC controller may be configured to not supply an input current to the TEC element, thus rendering it inoperable. In which case, heat generated by the IT component 14 may be transferred to the cold plate 15 (and into coolant flowing through the cold plate). Thus, the TEC element is a redundant (or backup) cooling solution to transfer the heat generated by the IT component into airflow when the temperature exceeds the temperature threshold.

Figure 3:
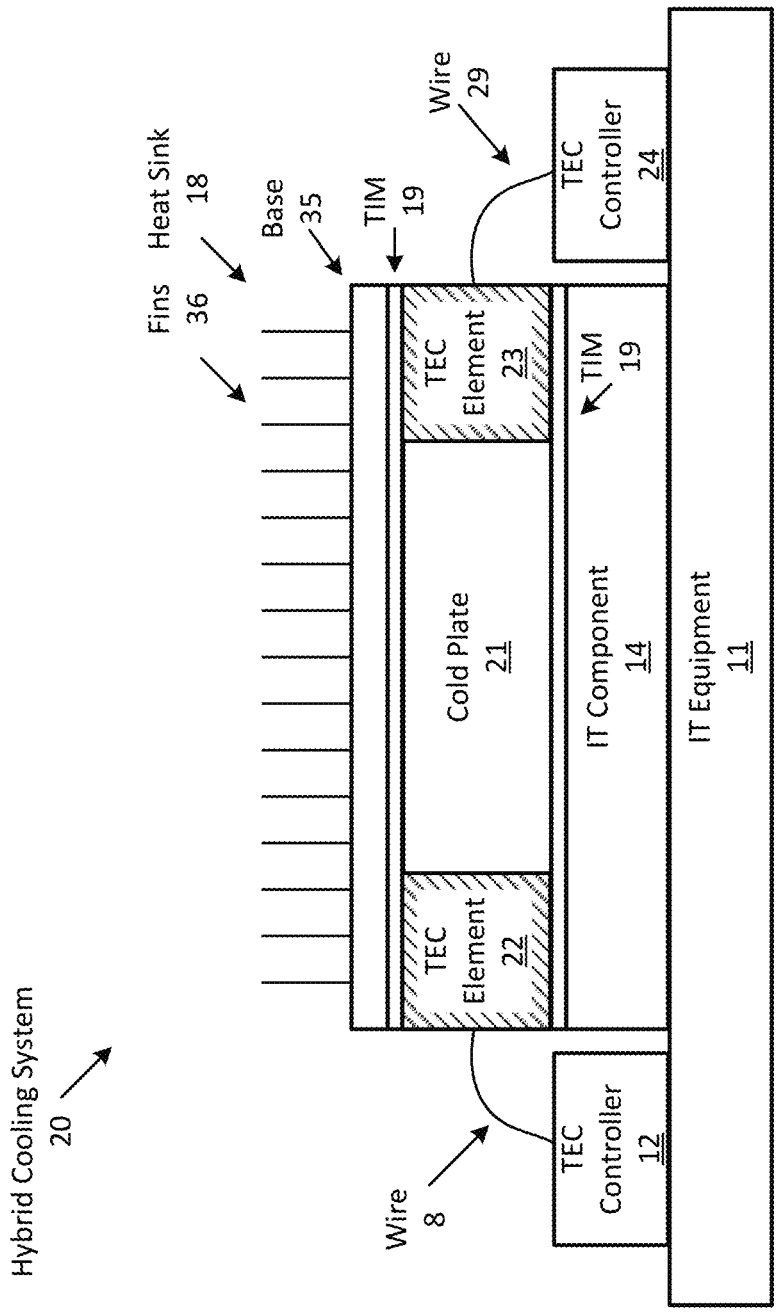
FIG. 3 is a block diagram illustrating another example of a hybrid cooling system according to one embodiment.

FIG. 3 is a block diagram illustrating another example of a hybrid cooling system according to one embodiment. This figure shows a hybrid cooling system 20 that includes the heat sink 18, a first TEC element 22, a cold plate 21, a second TEC element 23, a first TEC controller 12, and a second TEC controller 24.

As shown, the first TEC element 22, the cold plate 21, and the second TEC element 23 are mounted on the IT component. Specifically, the first TEC element is adjacent to a first (e.g., left) side of the cold plate, and the second TEC element is adjacent to a second (e.g., right) side of the cold plate. Thus, both TEC elements are arranged to come into (e.g., direct) contact with the sides of the cold plate. In one embodiment, both elements and the cold plate may be separate elements (or devices) from one another. In some embodiments, both TEC elements and the cold plate have similar dimensions, such as having a similar (or same) height. In another embodiment, at least some of them may be integrated units, such as both TEC elements and the cold plate being one integrated unit.

In one embodiment, the system 20 may include more or less TEC elements. For example, the system may only include one TEC element 22. In this case, the TEC element may be adjacent to either side of the cold plate 21. As another example, the system may include two or more TEC elements. For this configuration, each additional TEC element may be adjacent to at least one other TEC element. As another configuration, each side (of the four sides of the cold plate 21) may be adjacent to at least one TEC element, thus having at least four TEC elements.

In addition, a heat sink 18 is mounted on the first TEC element 22, the second TEC element 23, and cold plate 21. In some embodiments, the cold plate may be mounted on one or more of these elements, such as only being mounted on the TEC elements. In another embodiment, each TEC element may have its own individual heat sink. Thus, in this case, a first heat sink may be mounted on the first TEC element and a second heat sink may be mounted on the second TEC element. TIM 19 that is disposed between at least some of the elements illustrated herein. In particular, TIM 19 is disposed between 1) the IT component and the first TEC element 22, the second TEC element 23, and the cold plate 21 and 2) the (e.g., base 35 of the) heat sink 18 and both TEC elements and the cold plate. In one embodiment, the system 20 may include more or less TIM. For example, TIM may be disposed between one or both of the TEC elements and the cold plate. As another example, TIM may not be disposed between the heat sink and both TEC elements and the cold plate.

As shown, both TEC elements are coupled to a respective TEC controller. Specifically, TEC controller 12 is coupled via one or more wires 8 to the first TEC element 22, and TEC controller 24 is coupled via one or more wires 29 to the second TEC element 23. Each of the TEC controllers is configured to control (e.g., activate and/or regulate the input current of) its respective TEC element. In some embodiments, rather than having a respective TEC controller for each TEC element, a TEC controller may be coupled to one or more TEC elements. More about how the TEC elements of system 20 are controlled by one or more TEC controllers is described herein.

FIG. 4 is a block diagram illustrating a top-down view of the hybrid cooling system illustrated in FIG. 3. Specifically, this figure is shows a top-down view of the hybrid cooling system in which the heat sink 18 has been removed from on top of the TEC elements 22 and 23, and the cold plate 21. Also illustrated, the supply line 16 and the return line 17 are both coupled to the cold plate 21.

In one embodiment, at least one of the TEC controllers 12 and 24 may be configured to activate its respective TEC element in response to detecting a failure within the heat exchanging loop that includes the cold plate 21, as described herein. For example, the TEC controller 12 may activate the TEC element 22 and the TEC controller 24 may activate TEC element 23 in response to determining that the IT controller temperature exceeds a temperature threshold. In another embodiment, either controller may be coupled to both of the TEC elements and may be configured to activate both (or at least some) of the TEC elements, as described herein. Thus, similar to the hybrid cooling system 10 of FIG. 2, the TEC elements may be a redundant cooling solution.

In another embodiment, at least one of the TEC elements may be active while the heat exchanging loop is in operation. For example, both TEC elements may be configured to transfer at least a portion of heat generated by the IT component (and/or transfer at least a portion of heat from the cold plate 21) into the heat sink, while the cold plate transfers heat generated by the IT component into coolant flowing through it. Thus, along with being able to providing the redundant cooling solution, the TEC elements are able to work with the cold plate to draw heat away from the IT component in order to enhance the liquid cooling solution's cooling performance provided by the cold plate. In some embodiments, at least one of the TEC controllers 12 and 24 may be configured to adjust the performance of their respective TEC elements based on at least the temperature of the IT component, as described herein. For example, as the temperature rises, the TEC controllers may increase the input current (e.g., proportionally) in order to increase a cooling capability of its respective TEC element. In another embodiment, the TEC controllers may operate and/or regulate their respective TEC elements differently from one another (e.g., the TEC controller 12 providing a higher input current than an input current provided by TEC controller 24. More about adjusting the cooling performance of the TEC elements is described herein.

Figure 5:
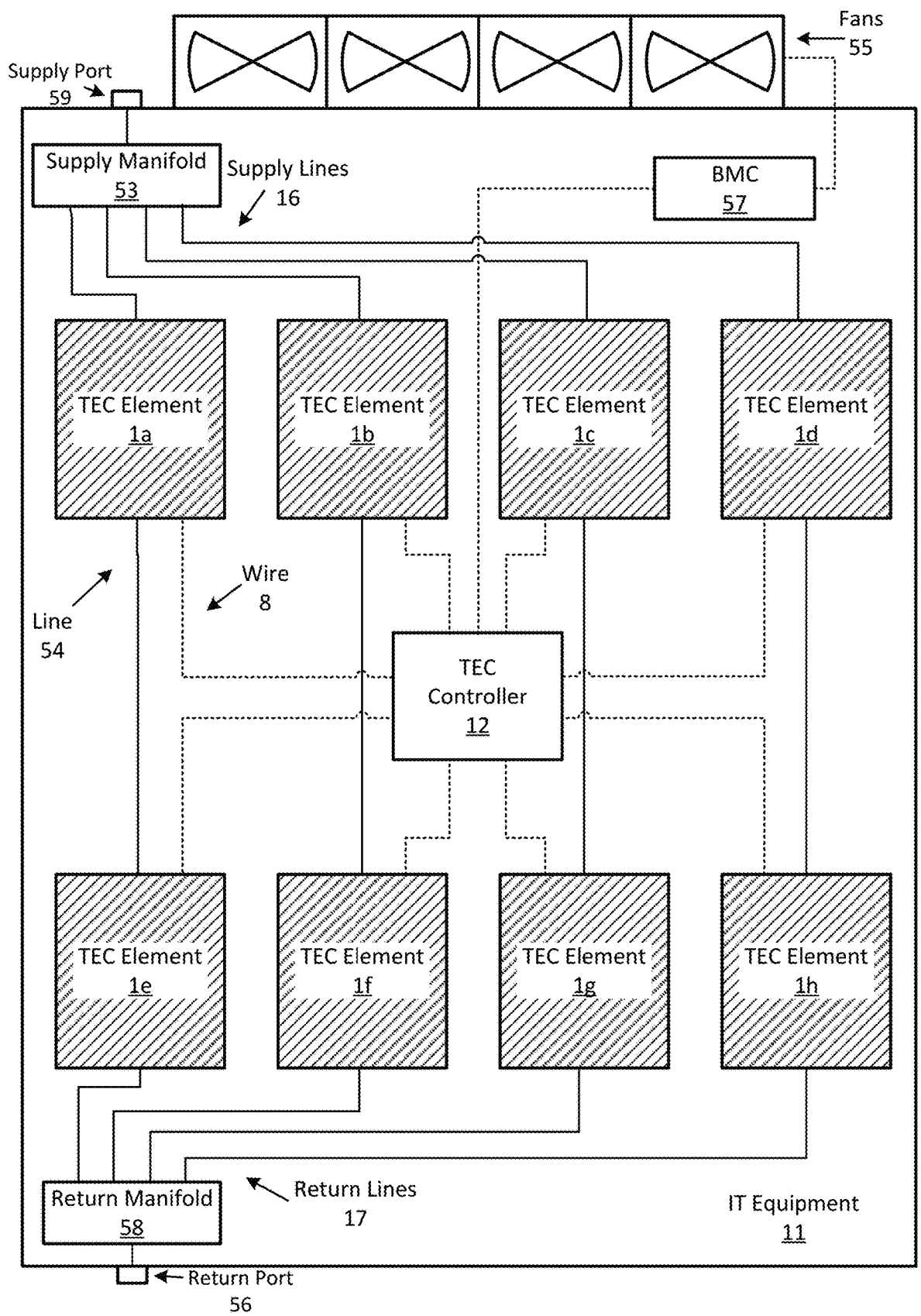
FIG. 5 is an example of a piece of information technology (IT) equipment with several TEC elements according to one embodiment.

FIG. 5 is an example of a piece of Information Technology (IT) equipment with several TEC elements according to one embodiment. Specifically, this figure illustrates (e.g., a top-down view of) the piece of IT equipment 11 that includes several (e.g., eight) IT components (not shown), which are each covered by individual TEC elements 1a-1h. The IT equipment also includes the TEC controller 12, a supply port 59, a supply manifold 53, a board management controller (BMC) 57, a return port 56, a return manifold 58, and one or more fans 55. Although not illustrated, a heat sink (e.g., heat sink 18) may be mounted on each of the TEC elements 1a-1h.

The supply port 59 is an inlet that is arranged to couple to a coolant source (e.g., via a main supply line). The supply manifold 53 is coupled to the supply port and is coupled to (the four top) cold plates (not shown) on which TEC elements 1a-1d are mounted, via individual supply lines 16 that are coupled to inlets of each of the four cold plates. Outlets of these cold plates are coupled to inlets of (the four bottom) cold plates (not shown) on which TEC elements 1e-1h are mounted via individual lines 54. Outlets of the four bottom cold plates are coupled to the return manifold 58, which is coupled to the return port 56. The return port 56 is an outlet that is arranged to couple to the coolant source. With both ports coupled to the coolant source, a heat exchanging loop as described herein.

In one embodiment, the supply and return ports 59 and 56 may be configured to removeably couple to the coolant source. In this case, the ports may be connectors such as dripless blind mating quick disconnects. For instance, each of these ports may be socket-type dripless connectors.

During operation, coolant flows through the heat exchanging loop. Specifically, the supply manifold 53 receives coolant from the coolant source via the supply port, and distributes the coolant to the four top cold plates. Each of the cold plates transfers (at least some of the) heat generated by an IT component on which the cold plate is mounted into the coolant flowing within the cold plate. Warmed coolant passes through each of the lines 54 and is received by the bottom four cold plates, which in turn transfers more heat into the warmed coolant, thereby producing warmer coolant. The warmer coolant is collected by the return manifold, via return lines 17, and is returned to the coolant source via the return port.

The BMC 57 is configured to communicate with one or more of the IT components mounted to the piece of IT equipment 11. For example, the BMC may be communicatively coupled with one or more sensors of each of the IT components, such as a temperature sensor. The BMC may be configured to receive a temperature reading (e.g., as a signal) from the temperature sensor and may be configured to transmit the temperature reading(s) (e.g., associated with each of the IT components) to the TEC controller 12. In another embodiment, the BMC is configured to communicate other data to the TEC controller, which may be used by the TEC controller for operating one or more of the TEC elements 1a-1h. For example, the BMC may be configured to receive an operating current of one or more IT components, from which the temperature of the IT components may be determined. As another example, the BMC may be configured to receive an ambient temperature reading (e.g., from within a data center room in which the piece of IT equipment 11 is located).

In another embodiment, the BMC 57 may be configured to control one or more of the fans 55. Specifically, the BMC may be configured to activate the fans by transmitting a control signal. As another example, the BMC may be configured to adjust a fan speed of one or more of the fans.

The TEC controller 12 is electrically coupled via one or more wires 8 with each of the TEC elements 1a-1h, and is configured to operate each of the TEC elements individually. For example, the TEC controller may activate TEC element 1a, while not activating the rest of the TEC elements. The TEC controller 12 is also communicatively coupled with the BMC 57, and is configured to receive data from the BMC. For example, the TEC controller is configured to receive temperature readings from the BMC, from which the TEC controller may determine whether or not to activate a TEC element (e.g., based on the element's associated IT component temperature being above a temperature threshold, as described herein).

In one embodiment, the TEC controller 12 may instruct the BMC 57 to activate one or more fans 55 in response to activating one or more TEC elements 1a-1h. For example, upon determining that the IT component temperature is above the temperature threshold, the controller 12 may activate the component's associated TEC element (e.g., element 1a), and transmit a control signal to the BMC 57 to activate the fans 55. In response, the BMC may activate one or more of the fans. In one embodiment, the BMC may set a fan speed of the fans to a maximum speed in order to provide sufficient airflow for rejecting heat from the heat sink of the activated TEC element. In some embodiments, the TEC controller may communicate directly with the fans.

Figure 6:
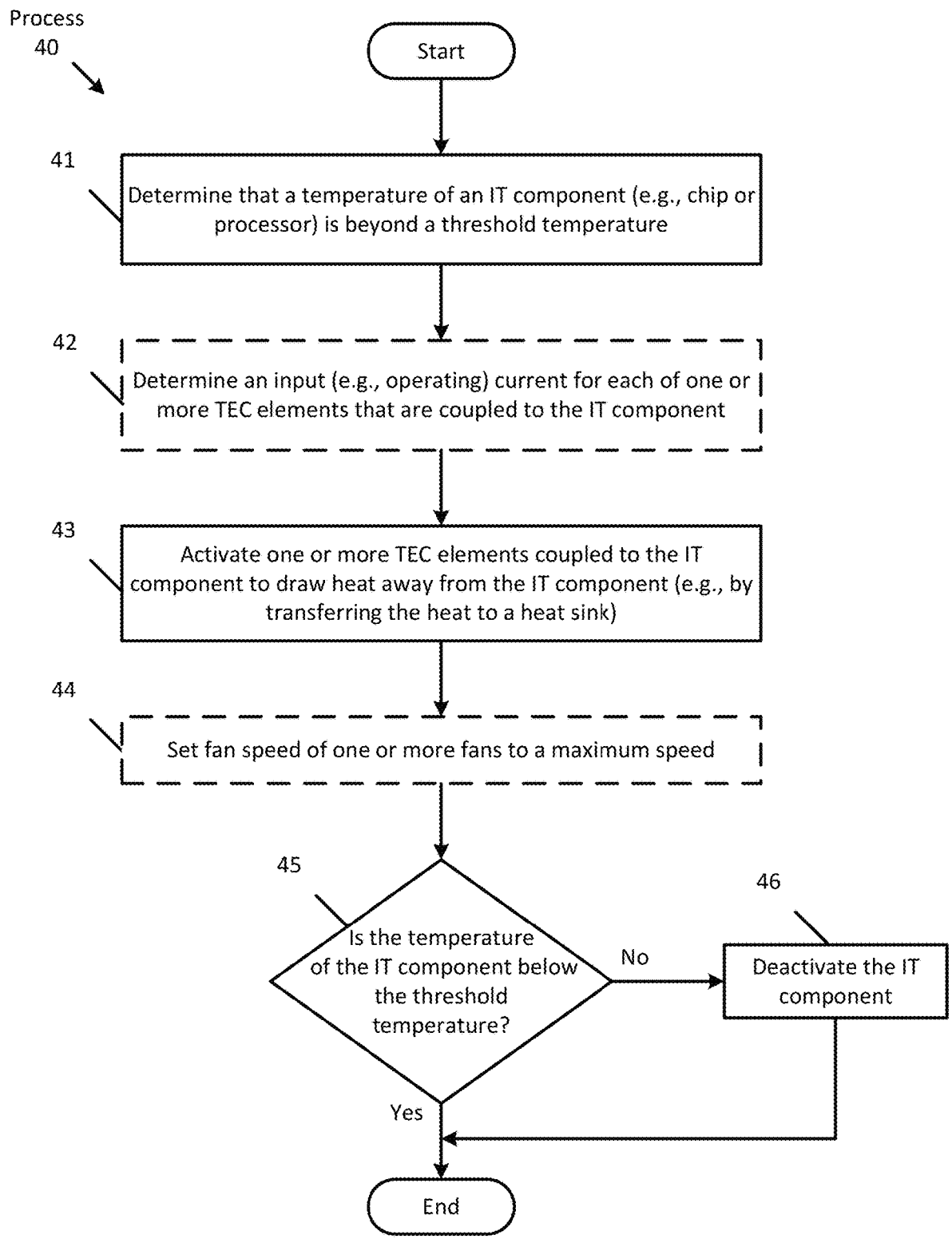
FIG. 6 is a flow chart of a process for activating one or more TEC elements based on the temperature of at least one IT component according to one embodiment.

FIG. 6 is a flow chart of a process for activating one or more TEC elements based on the temperature of at least one IT component according to one embodiment. Specifically, the process 40 may be performed by (e.g., one or more algorithms executing on) the controller 12 of the hybrid cooling system 10 and/or the controller 24 of the hybrid cooling system 20. The process 40 will be described with reference to FIGS. 2-5. The process 40 begins by determining that a temperature of an IT component (e.g., chip or processor) is beyond a temperature threshold (at block 41). For example, the controller 12 may receive a temperature reading from the BMC 57 of the IT component 14. Using this reading, the controller may determine whether the temperature exceeds the threshold (e.g., based on a comparison of the two temperature values). The process 40 determines an input (e.g., operating) current for the one or more TEC elements that are coupled to the IT component (at block 42). For example, the IT component 14 may only have one TEC element 1, as shown in FIG. 2. The TEC controller may determine the input current based on the temperature of the IT component (e.g., performing a table lookup into a data structure that associates temperatures with input currents). In another embodiment, the TEC controller may use other data (e.g., in addition to the temperature) for determining the input current. For example, the TEC controller may take into consideration the ambient temperature, a thermal design power of the IT component, a maximum allowable IT component temperature, and/or TEC element materials. In one embodiment, the TEC controller may base the determination on one or more of these considerations, for example by performing a table lookup into a data structure that associates one or more of the considerations with an input current.

The process 40 activates the one or more TEC elements coupled to the IT component to draw heat away from the IT component and transferring the teach to a heat sink (at block 43). The process 40 sets a fan speed of one or more fans to a maximum speed in order for the fans to supply airflow across the heat sink(s) (at block 44). The process 40 determines whether the temperature of the IT component is below the threshold temperature (at decision block 45). For example, the TEC controller may make this determination after a period of time from which the TEC element is activated (e.g., thirty seconds). If the temperature is not below the threshold temperature, meaning that the activation of the TEC element was unable to sufficiently cool the IT component, the process 40 deactivates the IT component (at block 46). In one embodiment, if, however, the temperature of the IT component is below the threshold temperature, the TEC controller may continue to drive the TEC element in order to maintain the temperature of the IT component below the threshold.

Figure 7:
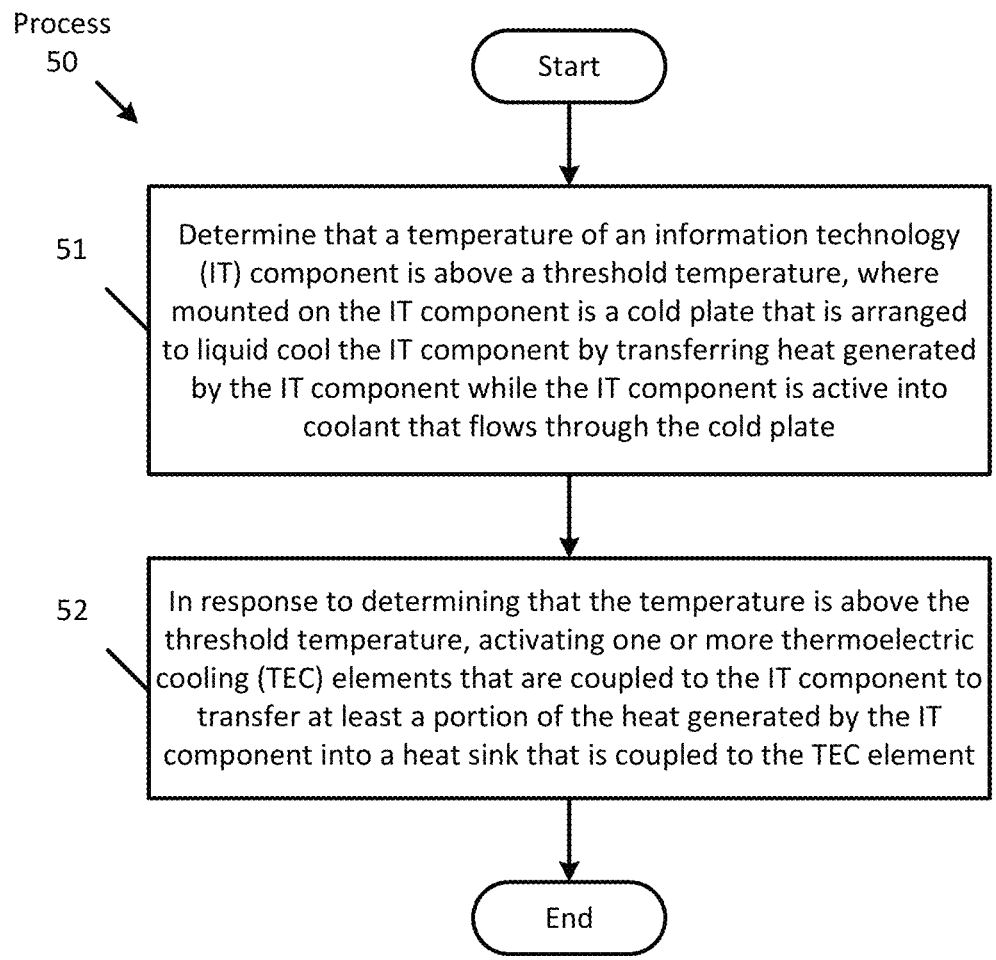
FIG. 7 is a flow chart of another process for activating one or more TEC elements according to another embodiment.

FIG. 7 is a flow chart of a process for activating one or more TEC elements according to another embodiment. Specifically, the process 50 may be performed by (e.g., one or more algorithms executing on) the controller 12 of the hybrid cooling system 10 and/or the controller 24 of the hybrid cooling system 20. The process 50 begins by determining that a temperature of an IT component is above (or greater than) a threshold temperature, where mounted on the IT component is a cold plate that is arranged to liquid cool the IT component by transferring heat generated by the IT component while the IT component is active into coolant that flows through the cold plate (at block 51). The process 50, in response to determining that the temperature is above the threshold temperature, activates one or more TEC elements that are coupled to the IT component to transfer at least a portion of the heat generated by the IT component into a heat sink that is coupled to the TEC element (at block 52). Heat transferred into the heat sink may then be rejected into the ambient environment (e.g., air flowing through the fins of the heat sink).

Some embodiments may perform variations to the processes described herein. For example, the specific operations of at least some of the processes may not be performed in the exact order shown and described. The specific operations may not be performed in one continuous series of operations and different specific operations may be performed in different embodiments. For example, some of the operational blocks illustrated in FIG. 6 may be optional (e.g. the boxes with dashed borders). Thus, the operations performed at block 42 and/or block 44 may be omitted by the process 40.

In another embodiment, at least some of the operations performed in process 40 may be periodically performed while a TEC element is active (e.g., once every minute, etc.). As described herein, the TEC controller 12 may regulate the input current of one or more TEC elements. Thus, the TEC controller may periodically determine the temperature and determine an input current for each of the one or more TEC elements, as described herein. Upon determining that the determined input current is different than a previously determined input current, the TEC controller may adjust the input current accordingly.

FIG. 8 is an example of an electronic rack with a hybrid cooling system according to one embodiment. Electronic rack 500 may include one or more server slots to contain one or more servers respectively. Each server includes one or more information technology (IT) components (e.g., processors, memory, storage devices, network interfaces). According to one embodiment, electronic rack 500 includes, but is not limited to, CDU 501, rack management unit (RMU) 502 (optional), a power supply unit (PSU) 550, one or more battery backup units (BBUs) 590, and one or more pieces of IT equipment (or IT equipment) 503A-503D, which may be any type of IT equipment, such as server blades. The IT equipment 503 can be inserted into an array of server slots respectively from frontend 504 or backend 505 of electronic rack 500. Each of the pieces of IT equipment includes one or more hybrid cooling system 10a-10d, respectively. In one embodiment, the hybrid cooling systems may be the same or similar to systems 10 and 20 of FIGS. 2 and 3. In another embodiment, at least one of the pieces of IT equipment may include both systems (e.g., having one IT component that is cooled with system 10 and another IT component that is cooled with system 20). The PSU 550 and/or BBU 590 may be inserted into any of server slots within the electronic rack 500.

Note that although there are only four pieces of IT equipment 503A-503D shown here, more or fewer pieces of IT equipment may be maintained within electronic rack 500. Also note that the particular positions of CDU 501, RMU 502, PSU 550, BBU 590, and IT equipment 503 are shown for the purpose of illustration only; other arrangements or configurations of these components. may also be implemented. Note that electronic rack 500 can be either open to the environment or partially contained by a rack container, as long as the cooling fans can generate airflows from the frontend to the backend (or generate airflows from the backend to the frontend).

In addition, a fan module can be associated with each of the pieces of IT equipment 503, the BBU 590, and/or with each hybrid cooling system 10a-10d. In this embodiment, fan modules 531A-531E, collectively referred to as fan modules 531, and are associated with the pieces of IT equipment 503A-503D and BBU 590, respectively. Each of the fan modules 531 includes one or more cooling fans. For instance, fan module 531A may include the one or more fans 55 as illustrated in FIG. 2. Fan modules 531 may be mounted on the backends of IT equipment 503, the backend 505 of the rack 500, and/or BBU 590 to generate airflows flowing from frontend 504, traveling through the rack 500, and existing at backend 505 of electronic rack 900. In another embodiment, one or more of the fan modules may be positioned on the frontend 504 of the rack 500. Such frontend fans may be configured to push air into the pieces of IT equipment 503.

In one embodiment, CDU 501 mainly includes heat exchanger 511, liquid pump 512, and a pump controller (not shown), and some other components such as a liquid reservoir, a power supply, monitoring sensors and so on. Heat exchanger 511 may be a liquid-to-liquid heat exchanger. Heat exchanger 511 includes a first loop with inlet and outlet ports having a first pair of liquid connectors coupled to external liquid supply/return lines 532-533 to form a primary loop. The connectors coupled to the external liquid supply/return lines 532-533 may be disposed or mounted on backend 505 of electronic rack 500. The liquid supply/return lines 532-533 are coupled to a set of room manifolds, which are coupled to an external heat removal system, or external cooling loop. In addition, heat exchanger 511 further includes a second loop with two ports having a second pair of liquid connectors coupled to liquid manifold 525 to form a secondary loop, which may include a supply manifold to supply cooling liquid to the pieces of IT equipment 503 and a return manifold to return warmer liquid back to CDU 501. For example, cold plates of each of the hybrid cooling systems 10a-10d may couple to the manifold 525. As another example, supply and return ports of the pieces of IT equipment (e.g., ports 59 and 56 illustrated in FIG. 5) may be removeably coupled to the manifold 525. Note that CDUs 501 can be any kind of CDUs commercially available or customized ones. Thus, the details of CDUs 501 will not be described herein.

In one embodiment, the BBU 590 is configured to provide backup power (e.g., drawing battery energy from battery cells contained therein) to the rack (e.g., one or more pieces of IT equipment 503) when the rack is not drawing power from a main power source, such as during a black out. In one embodiment, operations performed by any of the TEC controllers described herein (e.g., controller 12) may be performed by any of the components (e.g., IT equipment 503A) within the rack 500. For example, the IT equipment 503A may include a controller that is communicatively coupled with a BMC 57 and one or more TEC elements that are coupled to a different piece of IT equipment, such as equipment 503B.

Electronic rack 500 further includes optional RMU 502 configured to provide and manage power supplied to servers 503, fan modules 531, and CDU 501. Optimization module 521 and RMC 522 can communicate with a controller in some of the applications. RMU 502 may be coupled to PSU 550 to manage the power consumption of the PSU. The PSU 550 may include the necessary circuitry (e.g., an alternating current (AC) to direct current (DC) or DC to DC power converter, backup battery, transformer, or regulator, etc.,) to provide power to the rest of the components of electronic rack 500.

In one embodiment, RMU 502 includes optimization module 521 and rack management controller (RMC) 522. RMC 522 may include a monitor to monitor operating status of various components within electronic rack 500, such as, for example, the pieces of IT equipment 503, CDU 501, and fan modules 531. Specifically, the monitor receives operating data from various sensors representing the operating environments of electronic rack 500. For example, the monitor may receive operating data representing temperatures of the processors, cooling liquid, and airflows, which may be captured and collected via various temperature sensors. The monitor may also receive data representing the fan power and pump power generated by the fan modules 531 and liquid pump 512, which may be proportional to their respective speeds. These operating data are referred to as real-time operating data. Note that the monitor may be implemented as a separate module within RMU 502.

Based on the operating data, optimization module 521 performs an optimization using a predetermined optimization function or optimization model to derive a set of optimal fan speeds for fan modules 531 and an optimal pump speed for liquid pump 512, such that the total power consumption of liquid pump 512 and fan modules 531 reaches minimum, while the operating data associated with liquid pump 512 and cooling fans of fan modules 531 are within their respective designed specifications. Once the optimal pump speed and optimal fan speeds have been determined, RMC 522 configures liquid pump 512 and cooling fans of fan modules 531 based on the optimal pump speed and fan speeds.

As an example, based on the optimal pump speed, RMC 522 communicates with a pump controller of CDU 501 to control the speed of liquid pump 512, which in turn controls a liquid flow rate of cooling liquid supplied to the liquid manifold 525 to be distributed to at least some of server blades 503. Therefore, the operating condition and the corresponding cooling device performance are adjusted. Similarly, based on the optimal fan speeds, RMC 522 communicates with each of the fan modules 531 to control the speed of each cooling fan of the fan modules 531, which in turn control the airflow rates of the fan modules 531. Note that each of fan modules 531 may be individually controlled with its specific optimal fan speed, and different fan modules and/or different cooling fans within the same fan module may have different optimal fan speeds.

Note that some or all of the IT equipment 503 (e.g., 503A, 503B, 503C, and/or 503D) may utilize different cooling methods. For instance, one server may utilize air cooling while another server may utilize liquid cooling using at least one of the hybrid cooling systems described herein. Alternatively, different IT components mounted on a same piece of IT equipment may utilize different cooling solutions, such as one IT component utilising air cooling while another IT component utilizes the hybrid cooling system 10.

As previously explained, an embodiment of the disclosure may be (or include) a non-transitory machine-readable medium (such as microelectronic memory) having stored thereon instructions, which program one or more data processing components (generically referred to here as a "processor") to perform cooling operations, such the controlling one or more TEC elements and/or controlling one or more fans, as described herein. In other embodiments, some of these operations might be performed by specific hardware components that contain hardwired logic. Those operations might alternatively be performed by any combination of programmed data processing components and fixed hardwired circuit components.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

While certain aspects have been described and shown in the accompanying drawings, it is to be understood that such aspects are merely illustrative of and not restrictive on the broad disclosure, and that the disclosure is not limited to the specific constructions and arrangements shown and described, since various other modifications may occur to those of ordinary skill in the art. The description is thus to be regarded as illustrative instead of limiting.

In some aspects, this disclosure may include the language, for example, "at least one of [element A] and [element B]." This language may refer to one or more of the elements. For example, "at least one of A and B" may refer to "A," "B," or "A and B." Specifically, "at least one of A and B" may refer to "at least one of A and at least one of B," or "at least of either A or B." In some aspects, this disclosure may include the language, for example, "[element A], [element B], and/or [element C]." This language may refer to either of the elements or any combination thereof. For instance, "A, B, and/or C" may refer to "A," "B," "C," "A and B," "A and C," "B and C," or "A, B, and C."

What is claimed is:

1. A hybrid cooling system comprising:
a cold plate that is mounted on an information technology (IT) component that is mounted on a printed circuit board (PCB) of a piece of IT equipment, wherein the cold plate liquid cools the IT component by transferring heat generated by the IT component into coolant that flows through the cold plate;
a thermoelectric cooling (TEC) element that is mounted on top of the cold plate;
a heat sink that includes a base that is mounted on top of the TEC element, the heat sink having one or more fins; and
a controller that is mounted on the PCB and is configured to activate the TEC element to cause the TEC element to transfer at least a portion of the heat from the cold plate that is generated by the IT component into the one or more fins of the heat sink in response to determining that a temperature of the IT component exceeds a threshold temperature,
wherein, in response to the TEC element being activated for a period of time and the temperature of the IT component continuing to exceed the threshold temperature throughout the period of time, the hybrid cooling system is configured to deactivate the IT component, and
wherein a thermal interface material (TIM) is disposed between 1) the IT component and the cold plate, 2) the cold plate and the TEC element, and 3) the TEC element and the heat sink.

2. The hybrid cooling system of claim 1, wherein the controller is configured to activate the TEC element by:
determining that the coolant is no longer flowing through the cold plate; and
responsive to determining that the coolant is no longer flowing, beginning to provide an input current to the TEC element.

3. The hybrid cooling system of claim 1, wherein the TEC element, the cold plate, and the heat sink are one integrated unit.

4. The hybrid cooling system of claim 1 further comprising one or more fans that push ambient air onto the one or more fins of the heat sink, wherein the controller is further configured to activate the one or more fans in response to determining that the temperature of the IT component exceeds the threshold temperature.

5. An electronic rack comprising:
a plurality of pieces of information technology (IT) equipment arranged in a stack for providing data processing services, each piece of IT equipment including a processor mounted on a printed circuit board (PCB); and
for at least one piece of IT equipment
a cold plate that is mounted on the processor and liquid cools the processor by transferring heat generated by the processor into coolant that flows through the cold plate,
a thermoelectric cooling (TEC) element that is mounted on top of the cold plate,
a heat sink that includes a base that is mounted on top of the TEC element, the heat sink having one or more fins, and
a controller that is mounted on a respective PCB of the piece of IT equipment and is configured to activate the TEC element to cause the TEC element to transfer at least a portion of the heat from the cold plate that is generated by the processor into the one or more fins of the heat sink in response to determining that a temperature of the processor exceeds a threshold temperature,
wherein, in response to the TEC element being activated for a period of time and the temperature of the processor continuing to exceed the threshold temperature throughout the period of time, a corresponding piece of IT equipment is configured to deactivate the processor, and
wherein a thermal interface material (TIM) is disposed between 1) the processor and the cold plate, 2) the cold plate and the TEC element, and 3) the TEC element and the heat sink.

6. The electronic rack of claim 5, wherein the controller is configured to activate the TEC element by:
determining that the coolant is no longer flowing through the cold plate; and
responsive to determining that the coolant is no longer flowing, beginning to provide an input current to the TEC element.

7. The electronic rack of claim 5 further comprising one or more fans that push ambient air onto the one or more fins of the heat sink, wherein the controller is further configured to activate the one or more fans in response to determining that the temperature of the processor exceeds the threshold temperature.

8. The hybrid cooling system of claim 4, wherein the controller is a first controller, wherein the system further comprises a second controller that is communicatively coupled to the first controller and the one or more fans, wherein the first controller activates the fans by transmitting a control signal to the second controller, which in response the second controller activates the one or more fans and sets a fan speed of the one or more fans to a maximum speed.

9. The electronic rack of claim 5 further comprises a heat exchanger that is coupled to a liquid manifold disposed within the electronic rack,
wherein the cold plate is a first cold plate, the processor is a first processor, and the TEC element is a first TEC element, wherein the at least one piece of IT equipment further includes:
a supply manifold and a return manifold that are fluidly coupled to the liquid manifold of the electronic rack,
a second cold plate that is mounted on a second processor of the at least one piece of IT equipment, wherein the first and second cold plates are fluidly coupled to the supply manifold and the return manifold, and
a second TEC element that is mounted on the second cold plate,
wherein the controller is configured to independently activate the first and second TEC elements.

10. The electronic rack of claim 7, wherein the controller is a first controller, wherein the rack further comprises a second controller that is communicatively coupled to the first controller and to the one or more fans, wherein the first controller activates the fans by transmitting a control signal to the second controller, which in response the second controller activates the one or more fans and sets a fan speed of the one or more fans to a maximum speed.

11. A piece of information technology (IT) equipment for an electronic rack, the piece of IT equipment comprising:
- an IT component mounted on a printed circuit board (PCB);
- a cold plate coupled to the IT component, wherein the cold plate liquid cools the IT component by transferring heat generated by the IT component into coolant that flows through the cold plate;
- a thermoelectric cooling (TEC) element that is mounted on top of the cold plate;
- a heat sink that is mounted on top of the TEC element, the heat sink having one or more fins; and
- a controller that is mounted on the PCB and is configured to activate the TEC element to cause the TEC element to transfer at least a portion of the heat from the cold plate that is generated by the IT component into the one or more fins of the heat sink in response to determining that a temperature of the IT component exceeds a threshold temperature, wherein, in response to the TEC element being activated for a period of time and the temperature of the IT component continuing to exceed the threshold temperature, the piece of IT equipment is configured to deactivate the IT component, and wherein a thermal interface material is disposed between 1) the IT component and the cold plate, 2) the cold plate and the TEC element, and 3) the TEC element and the heat sink.

12. The piece of IT equipment of claim 11, wherein the controller is configured to activate the TEC element by:
- determining that the coolant is no longer flowing through the cold plate; and
- responsive to determining that the coolant is no longer flowing, beginning to provide an input current to the TEC element.

* * * * *